United States Patent
Lee et al.

(10) Patent No.: US 7,201,859 B2
(45) Date of Patent: Apr. 10, 2007

(54) HOLE TRANSPORT LAYER AND METHOD FOR MANUFACTURING THE ORGANIC EL DEVICE BY USING THE SAME

(75) Inventors: Jun-Yeob Lee, Gyeonggi-do (KR); Young-Sook Choi, Gyeonggi-do (KR); Michael Redecker, Berlin (DE); Kerstin Nolte, Berlin (DE)

(73) Assignee: Samsung SDI Co., Ltd., Suwon (KR)

( * ) Notice: Subject to any disclaimer, the term of this patent is extended or adjusted under 35 U.S.C. 154(b) by 492 days.

(21) Appl. No.: 10/173,679

(22) Filed: Jun. 18, 2002

(65) Prior Publication Data

US 2003/0010959 A1  Jan. 16, 2003

(30) Foreign Application Priority Data

Jun. 25, 2001  (KR) .............................. 2001-36400

(51) Int. Cl.
H05B 33/00 (2006.01)
H05B 33/12 (2006.01)
H01B 1/00 (2006.01)

(52) U.S. Cl. ............ 252/500; 252/519.12; 252/519.21; 252/519.31; 428/917; 428/407; 428/690; 313/506; 313/502; 313/504; 427/66; 528/373; 528/377; 528/278; 524/81; 430/58; 430/65; 430/59.1

(58) Field of Classification Search ................ 252/500, 252/511, 519.21, 521.6, 519.2, 520.1, 521; 427/66; 428/917, 407, 690; 313/506, 502–504, 313/510; 257/40; 528/373, 377; 524/81; 430/58, 65, 59.1
See application file for complete search history.

(56) References Cited

U.S. PATENT DOCUMENTS

| 5,030,541 A | * | 7/1991 | Hayashi ...................... 430/138 |
| 5,518,824 A | | 5/1996 | Funhoff et al. |
| 5,922,481 A | | 7/1999 | Etzbach et al. |
| 5,965,063 A | * | 10/1999 | Agata et al. ................. 252/500 |
| 6,103,379 A | * | 8/2000 | Margel et al. ............... 428/403 |
| 6,416,885 B1 | * | 7/2002 | Towns et al. ................ 428/690 |
| 6,515,417 B1 | * | 2/2003 | Duggal et al. .............. 313/506 |
| 6,573,650 B2 | * | 6/2003 | Aoki et al. .................. 313/503 |
| 6,638,680 B2 | * | 10/2003 | Lamotte et al. ............. 430/160 |

FOREIGN PATENT DOCUMENTS

| JP | 03-084892 | 4/1991 |
| JP | 09-279135 | 10/1997 |
| JP | 2000-306669 | 11/2000 |
| JP | 2000-323276 | 11/2000 |
| JP | 2002-015867 | 1/2002 |
| KR | 1998-014053 | 5/1998 |

OTHER PUBLICATIONS

Faber et al, "Anodic Oxidation of Novel Hole-Transporting Materials Derived from Tetraarylbenzidines, Electrochemical and Spectroscopic Characterization," Collect. Czech. Chem. Commun. 2000, V65, pp. 1403-1418.*
Wu et al, "Efficient Organic Electroluminescent Devices Using Single-Layer Doped polymer Thin Films with Bipolar Carrier Transport Abilities," IEEE Trans. Elec. Dev., 1997, V44(8), p. 1269-1281.*
Nelson et al, "Anodic Oxidation Pathways of Substituted Triphenylamines. II. Quantitative Studies of Benzidine formation," J. Am. Chem. Soc., 1968, V90(15), p. 3925-3930.*
Periodic Table, 2006, www.swansontec.com.*

* cited by examiner

Primary Examiner—Mark Kopec
Assistant Examiner—Kallambella Vijayakumar
(74) Attorney, Agent, or Firm—H.C. Park & Associates, PLC

(57) ABSTRACT

The present invention discloses a hole transport layer of an organic EL display, comprising: a material including one of a PEDOT which is a mixture of a poly (3,4)-ethylenedioxythiophene and a polystyrenesulfonate, a PANI which is a mixture of a polyaniline and a polystyrenesulfonate, and an aromatic amine derivative; and an organic compound derivative having the general structure, $R_1R_2MR_3R_4$, where "M" denotes one metal selected from a group consisting of Ti, Pt and one metal among elements belonging to groups 3A and 4A of periods 3 to 5.

25 Claims, No Drawings

HOLE TRANSPORT LAYER AND METHOD FOR MANUFACTURING THE ORGANIC EL DEVICE BY USING THE SAME

CROSS REFERENCE TO RELATED APPLICATION

This application claims priority to and the benefit of Korean Patent Application No. 2001-0036400, filed on Jun. 25, 2001, which is hereby incorporated by reference for all purposes as if fully set forth herein.

BACKGROUND OF THE INVENTION

1. Field of the Invention

The present invention relates to a hole transport layer, an organic EL display and a method for manufacturing an organic EL display.

2. Description of Related Art

An organic EL display includes a low molecular organic EL display and a high molecular organic EL display.

The low molecular organic EL display generally includes an anode electrode, a hole injection layer, a hole transport layer, an organic light-emitting layer, an electron transport layer, an electron injection layer, and a cathode layer, which are sequentially stacked on a substrate. The hole transport layer can be removed selectively.

The high molecular organic EL display generally includes an anode electrode, a hole transport layer, an organic light-emitting layer, and a cathode electrode, which are sequentially stacked on a substrate.

The molecular organic EL display forms the layers using a vacuum deposition technique. However, the high molecular organic EL display forms, the layers using a solution processing technique. This limits the formation of the organic light-emitting layer made of an organic material.

In particular, the hole transport layer must have a stable characteristic to a wet coating process to form the organic light-emitting layer using an organic solvent. The hole transport layer is generally made of a water-soluble high molecular weight material such as a mixture of a poly(3,4)-ethylenedioxythiophene (PEDOT) and a polystyrene-sulfonate or a mixture of a polyaniline (PANI) and a polystyrenesulfonate. Therefore, there is a problem in that an interface characteristic between the hydrophilic hole transport layer and the hydrophobic organic light-emitting layer is created.

For example, since a bonding power between the hole transport layer and the organic light-emitting layer is low, a life span of the organic EL display is shortened. Also, the organic light-emitting layer cannot be formed on the hydrophilic hole transport layer using an ink-jet technique or a laser induced thermal imaging (LITI) technique, even though the ink-jet printing technique and the LITI technique have an advantage in that it is easy to define pixels and achieve a full color light emission.

U.S. Pat. Nos. 5,518,824 and 5,922,481 disclose the hole transport layer including a cross-linkable material. However, the hole transport layer shows a bad interface characteristic between the hole transport layer and the organic light-emitting layer and between the anode electrode and the hole transport layer.

SUMMARY OF THE INVENTION

To overcome the problems described above, preferred embodiments of the present invention provide an organic EL display with a hole transport layer having a stable structure.

It is another object of the present invention to provide an organic EL display having a longer life span.

A further object of the present invention is to provide an organic EL display having an excellent interface characteristic between a hole transport layer and an organic light-emitting layer.

Still further, an object of the present invention is to provide an organic EL display having an excellent interface characteristic between a hole transport layer and an anode electrode.

It is yet another object of the present invention to provide an organic EL display having a high brightness.

In order to achieve the above objects, the preferred embodiments of the present invention provide a hole transport layer of an organic EL display, comprising: a material including one of a PEDOT which is a mixture of a poly (3,4)-ethylenedioxythiophene and a polystyrenesulfonate, a PANI which is a mixture of a polyaniline and a polystyrenesulfonate, and an aromatic amine derivative; and an organic compound derivative having a structure of a formula 1: $R_1R_2MR_3R_4$, where "M" denotes one metal selected from a group consisting of Ti, Pt and one metal among elements belonging to groups 3A and 4A of periods 3 to 5, and "$R_1$" to "$R_4$" each denotes one functional group selected from a group consisting of a hydroxy group, an alkylhydroxy group, a methoxy group, an ethoxy group, a hydrogen, an alkyl group including 1 to 20 carbons, a halogen group, a cyano group, a nitro group, an aryl group including 6 to 15 carbons, a fused aromatic group having a ring, an aromatic halide group, an alkyamine group, an aryloxy group, an arylamine group, an alkylepoxide group, a vinyl group, an alkymercapto group, an acetoxy group, an siloxane group, and an imide group.

One metal among elements belonging to groups 3A and 4A of periods 3 to 5 includes one metal selected from a group consisting of Si, Sn and Al. A concentration of the organic compound derivative is in a range between about 0.0001 wt % and 50 wt %.

The hole transport layer further includes a surfactant. The surfactant includes one selected from a group consisting of an alkyl group, an alkylaryl group, a fluoroalkyl group, and an alkylsiloxane group, a sulfate, a sulfonate, a carboxylate, an amide, a betainic structures, and a quarternised ammonium group. The surfactant includes a non-ionic surfactant. The non-ionic surfactant is a non-ionic fluoride-based surfactant. The surfactant is in a range between 0.1 wt % and 0.3 wt %.

The aromatic amine derivative has a structure of one of the following formulas 2A, 2B and 2C:

$R_1R_2N$-Ph-Ph-$NR_3R_4$ <Formula 2A>

$R_2N$-NA-NA-$NR_3R_4$ <Formula 2B>

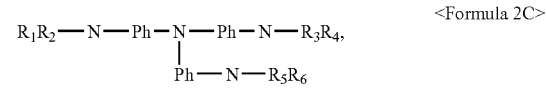

<Formula 2C>

$R_1R_2$—N—Ph—N—Ph—N—$R_3R_4$,
          |
         Ph—N—$R_5R_6$ wherein "Ph" denotes a benzene ring, "NA" denotes a naphthalene group, and "R1" to "R6" each denotes a material selected from a group consisting of a hydrogen, an alkyl group including 1 to 20 carbons, a halogen group, a cyano group, a nitro group, an aryl group including 6 to 15 carbons, a fused aromatic group having a ring, an alkyamine group, an aryloxy group, and an arylamine group.

A concentration of the PEDOT, the PANI or the aromatic amine derivative is in a range between 0.01 wt % and 50 wt %.

The present invention further provides a hole transport layer of an organic EL display, comprising a mixture of a PEDOT and a polystryrenesulfonate, mixture of a PANI and a polystyrenesulfonate, and an aromatic amine derivative. The hole transport layer further comprises an organic compound derivative hydrolyzed in a water containing solution, forming a structure cured by a heat treatment after a coating process, or lowering a surface energy of a coating surface after a coating process.

The organic compound derivative has a central metal atom and has a molecular weight about 100 to 10,000 g/mol. The metal is selected from a group consisting of Ti, Pt and one metal among elements belonging to groups 3A and 4A of period 3 to period 5. One metal among elements belonging to groups 3A and 4A of periods 3 to 5 includes one metal selected from a group consisting of Si, Sn and Al. The concentration of the organic compound derivative may range from about 0.0001 wt % to about 50 wt %.

The present invention further provides a method of manufacturing an organic EL display having the hole transport layer, comprising: forming an organic light-emitting layer using one of a spin coating technique, an ink-jet printing technique, a vacuum depositing technique, and a laser induced thermal imaging technique. The hole transport layer may include a surfactant, and the organic light-emitting layer may be formed using an ink-jet printing technique.

The present invention further provides a hole transport layer of an organic EL display comprising one of a mixture of PEDOT and polystyrenesulfonate, a mixture of PANI and polystyrenesulfonate, and an aromatic amine derivative and a surfactant.

The surfactant may include one selected from a group consisting of an alkyl group, an alkylaryl group, a fluoroalkyl group, and an alkylsiloxane group, a sulfate, a sulfonate, a carboxylate, an amide, a betainic structures, and a quarternised ammonium group.

DETAILED DESCRIPTION OF PREFERRED EMBODIMENTS

A hole transport layer according to the present invention can be applied to both a low molecular organic EL display and a high molecular organic EL display.

The hole transport layer material used to form the hole transport layer according to the present invention includes a first hole transport layer material and a second hole transport material.

The first hole transport material that forms a conventional hole transport layer and includes one of a mixture of a poly (3,4)-ethylenedioxythiophene (PEDOT) and a polystyrenesulfonate, a mixture of a polyaniline (PANI) and a polystyrenesulfonate, and an aromatic amine derivative.

The second hole transport layer material includes an organic compound derivative, and contains one metal selected from a group consisting of Ti, Pt and one metal among elements belonging to groups 3A and 4A of period 3 to period 5. The organic compound derivative has a molecular weight ranging from about 100 to 10,000g/mol.

The organic compound derivative can be represented generally by the following chemical formula:

$$R_1R_2MR_3R_4 \qquad \text{<Formula 1>}$$

Formula 1, "M" denotes one metal selected from a group consisting of Ti, Pt and one metal belonging to groups 3A and 4A of periods 3 to 5 of the periodic table. The metal M preferably includes Si, Sn or Al, and more preferably Si.

"$R_1$" to "$R_4$" each denotes a group selected from a group consisting of a hydroxy group, an alkylhydroxy group, a methoxy group, an ethoxy group, a hydrogen, an alkyl group ranging from 1 to 20 carbons, a halogen group, a cyano group, a nitro group, an aryl group ranging from 6 to 15 carbons, a fused aromatic group having a ring, an aromatic halide group, an alkyamine group, an aryloxy group, an arylamine group, an alkylepoxide group, a vinyl group, an alkymercapto group, an acetoxy group, a siloxane group, and an imide group.

The aromatic amine derivative of the first hole transport layer material preferably has an amine derivative having a structure of one of the following formulas 2A, 2B and 2C:

$$R_1R_2N\text{-}Ph\text{-}Ph\text{-}NR_3R_4, \qquad \text{<Formula 2A:>}$$

$$R_1R_2N\text{-}NA\text{-}NA\text{-}NR_3R_4, \qquad \text{<Formula 2B:>}$$

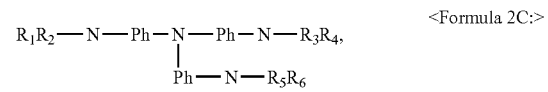

$$\begin{array}{c} R_1R_2\text{---}N\text{---}Ph\text{---}N\text{---}Ph\text{---}N\text{---}R_3R_4, \\ | \\ Ph\text{---}N\text{---}R_5R_6 \end{array} \qquad \text{<Formula 2C:>}$$

wherein "Ph" denotes a benzene ring, "NA" denotes a naphthalene group, and "$R_1$" to "$R_6$" each denotes a material selected from a group consisting of a hydrogen, an alkyl group ranging from 1 to 20 carbons, a halogen group, a cyano group, a nitro group, an aryl group ranging from 6 to 15 carbons, a fused aromatic group having a ring, an alkyamine group, an aryloxy group, and an arylamine group.

The inventive hole transport layer material can further include a surfactant so as to lower a surface tension of the hole transport layer. The inventive hole transport layer material can contain the conventional hole transport layer and the surfactant without the organic compound derivative layer.

The surfactant includes a hydrophobic moiety such as an alkyl group, an alkylaryl group, a fluoroalkyl group, and an alkylsiloxane group, or a hydrophilic moiety such as a sulfate, a sulfonate, a carboxylate, an amide, a betainic structures, and a quarternized ammonium group. Preferably, the surfactant includes a nonionic hydrophobic moiety such as a polyether group and a nonionic fluoride-based surfactant. The surfactant having a relatively low concentration, is preferably in a range from about 0.1 wt % to about 0.3 wt %, and most preferably is about 0.2 wt %.

A process of forming the hole transport layer will be described. First, the hole transport layer material is prepared such that the conventional hole transport layer material and the organic compound derivative is sequentially dispersed in either an organic solvent or a mixed solution of water and an organic solvent. At this point in the process, the organic compound derivative is hydrolyzed. Preferably, the organic compound derivative is added in an amount ranging from about 0.0001 wt % to about 50 wt %.

Thereafter, the hole transport layer material is deposited using a spin coating process, a dip coating process, an ink-jet printing process, or a roll coating process. The hole transport layer coated is cured by a heat treatment to form the hole transport layer having a stable molecular structure, i.e., a network structure.

In other words, since functional groups connected to the central metal M of the organic compound derivatives are substituents which are easily substituted after coating or deposition, the organic compound derivative layer forms a crosslinked structure through a substitution reaction and a condensation reaction by heat treatment. Accordingly, the organic compound derivative layer has a stable molecular structure, i.e., network structure.

The hole transport layer containing organic compound derivative forms a stable chemical or physical bonding with an anode electrode, whereby the bonding power between an anode electrode and the hole transport layer is improved.

The contact angle of the hole transport layer to water can be varied from 5° to 130° depending on the concentration and polarity of the organic compound derivative. Hence, the surface energy of the hole transport layer can be adjusted to be suitable for the organic light-emitting layer. In other words, the bonding power between the hole transport layer and the organic compound derivative layer is improved, whereby the life span of the organic EL device is increased.

In addition, the organic compound derivative has both a hydrophobicity and a hydrophilicity, which improves the bonding power between the hole transport layer and the organic light-emitting layer. As a result, interface characteristic between the hole transport layer and the organic light-emitting layer and transportability of holes from the anode electrode to the organic light-emitting layer are improved. The organic light-emitting layer can be formed on the hole transport layer using an ink-jet printing technique or a laser induced thermal imaging (LITI) technique. Accordingly, a full color light emission can be achieved. Also, brightness of the organic EL display is improved.

Embodiment 1

An anode electrode is formed on a substrate to a thickness of 150 nm to 200 nm. A glycidoxypropyltrimethoxy silane (GPS) of 0.13 wt % is added to a PEDOT solution of 1.3 wt %. The GPS and the PEDOT are intensely mixed at an atmospheric temperature during one hour to prepare a hole transport layer material. The hole transport layer material is filtered by a filter in which the micro pores have a diameter of 0.2 μm and is coated on the substrate having the anode electrode at a speed of 300 rpm during 40 seconds using a spin coating technique. The deposited hole transport layer material is dried at a temperature of 200° C. during five minutes to form a hole transport layer to a thickness of 50 nm.

Subsequently, a polyfluorene-based organic light-emitting layer is deposited on the hole transport layer to a thickness of 80 nm and dried. The cathode electrode is formed on the organic EL display. The cathode electrode has a dual-layered structure of Ca and Ag. The Ca layer has a thickness of 30 nm, and the Ag layer has a thickness of 250 nm.

The life span of the organic EL display of Embodiment 1 increased by 100% and the light emitting efficiency increased by 30% over conventional organic EL displays. In addition, a contact angle of the inventive hole transport layer to water varies to 5° by varying a surface energy of the hole transport layer, while a contact angel between the conventional hole transport layer made of the PEDOT and water is 11°. An interface characteristic between the hole transport layer and the organic light-emitting layer is significantly improved.

Meanwhile, when a methacryloxypropyltrimethoxysilane is mixed with the PEDOT, a contact angle to water is varied to 40°. It can be understood that surface energy of the hole transport layer can be adjusted according to a kind and a content of a material mixed with the PEDOT.

Embodiment 2

An anode electrode is formed on a substrate to a thickness of 150 nm to 200 nm. A glycidoxypropyltrimethoxy silane (GPS) of 0.13 wt % is added to a PEDOT solution of 1.3 wt %. The GPS and the PEDOT are intensely mixed at an atmospheric temperature during one hour to prepare a hole transport layer material. The hole transport layer material is filtered by a filter that has a micropore diameter of 0.2 μm and is coated on the substrate having the anode electrode at a speed of 300 rpm during 40 seconds using a spin coating technique. The deposited hole transport layer material is dried at a temperature of 200° C. during five minutes to form a hole transport layer to a thickness of 50 nm.

An organic light-emitting layer spin-coated on a PET film is copied on the hole transport layer using a laser induced thermal imaging (LITI) technique to form an organic light-emitting layer.

Subsequent processes were identical to those of Embodiment 1.

The organic light-emitting layer is copied on the inventive hole transport layer using the LITI technique. Accordingly, the organic EL display can have an organic light-emitting layer pattern having a desired interval and thus achieve a full color light emission.

Embodiment 3

An anode electrode is formed on a substrate to a thickness of 150 nm to 200 nm. A perfluoroalkyl-sulphamido-polyether of 0.4 wt % as a surfactant is added to a PEDOT solution of 1.3 wt %. The perfluoroalkyl-sulphamido-polyether and the PEDOT are intensely mixed at an atmospheric temperature during one hour to prepare a hole transport layer material. The hole transport layer material is filtered by a filter that has a micropore diameter of 0.2 μm and is coated on the substrate having the anode electrode at a speed of 300 rpm during 40 seconds using a spin coating technique. The deposited hole transport layer material is dried at a temperature of 200° C. during five minutes to form a hole transport layer having a thickness of 50 nm.

An organic light-emitting layer is coated on the hole transport layer using an ink-jet printing technique to form an organic light-emitting layer. Subsequent processes are identical to those of Embodiment 1.

The hole transport layer material is prepared by mixing the conventional hole transport layer material and the surfactant. Since hydrophobicity of the inventive hole transport layer increases, the organic light-emitting layer is formed uniformly on the inventive hole transport layer.

As described herein before, by using the inventive hole transport layer material having a stable structure, i.e., a network structure, the interface characteristic between the hole transport layer and an organic light-emitting layer is significantly improved. Accordingly, an organic EL display has a lengthy life span. Further, the organic light-emitting layer can be formed using an ink-jet technique or a LITI technique, and therefore it is easy to define pixels and to achieve a full color light emission. Furthermore, light emitting efficiency is improved.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A hole transport layer of an organic EL display, comprising:
   one of a mixture of a poly (3,4)-ethylenedioxythiophene (PEDOT) and a polystyrenesulfonate, a mixture of a polyaniline (PANI) and a polystyrenesulfonate, and an aromatic amine derivative; and
   an organic compound derivative having a structure with the following formula:

$R_1R_2MR_3R_4$ wherein "M" denotes a metal selected from the group consisting of Ti, Pt, and metals belonging to groups 3A and 4A of periods 3 to 5, and "$R_1$" to "$R_4$" each denotes a functional group selected from the group consisting of a hydroxyl group, a hydrogen, a cyano group, a nitro group, an aryl group ranging from 6 to about 15 carbons, a fused aromatic group having a ring, an aromatic halide group, an alkylamine group, an aryloxy group, an arylamine group, an alkylepoxide group, a vinyl group, an alkylmercapto group, and an imide group.

2. The hole transport layer of claim 1, wherein M includes a metal selected from the group consisting of Si, Sn, and Al.

3. The hole transport layer of claim 1, wherein a concentration of the organic compound derivative ranges from about 0.0001 wt % to about 50 wt %.

4. The hole transport layer of claim 1, further comprising, a surfactant.

5. The hole transport layer of claim 4, wherein the surfactant includes one selected from a group consisting of an alkyl group, an alkylaryl group, a fluoroalkyl group, and an alkylsiloxane group, a sulfate, a sulfonate, a carboxylate, an amide, a betainic structures, and a quarternised ammonium group.

6. The hole transport layer of claim 5, wherein the surfactant includes a non-ionic surfactant.

7. The hole transport layer of claim 6, wherein the non-ionic surfactant is a non-ionic fluoride-based surfactant.

8. The hole transport layer of claim 4, wherein the surfactant has a concentration ranging from about 0.1 wt % to about 0.3 wt %.

9. The hole transport layer of claim 1, wherein the aromatic amine derivative is selected from the group consisting of:

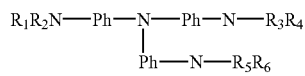

wherein "Ph" is a benzene ring, "NA" denotes a naphthalene group, and "$R_1$" to "$R_6$" each denote a material selected from the group consisting of a hydrogen, an alkyl group ranging from 1 to about 20 carbons, a halogen group, a cyano group, a nitro group, an aryl group ranging from 6 to about 15 carbons, a fused aromatic group having a ring, an alkyamine group, aryloxy group, and an arylamine group.

10. The hole transport layer of claim 1, wherein a concentration of the PEDOT, the PANI or the aromatic amine derivative ranges from about 0.01 wt % to about 50 wt %.

11. A method for manufacturing an organic EL display having a hole transport layer, comprising:
   preparing a hole transport layer material comprising:
      one of a mixture of a poly (3,4)-ethylenedioxythiophene (PEDOT) and a polystyrenesulfonate, a mixture of a polyaniline (PANI) and a polystyrenesulfonate, and an aromatic amine derivative; and
      an organic compound derivative having a structure with the following formula:

$R_1R_2MR_3R_4$ wherein "M" denotes a metal selected from the group consisting of Ti, Pt, and metals belonging to groups 3A and 4A of periods 3 to 5, and "$R_1$" to "$R_4$" each denotes a functional group selected from the group consisting of a hydroxyl group, a hydrogen, a cyano group, a nitro group, an aryl group ranging from 6 to about 15 carbons, a fused aromatic group having a ring, an aromatic halide group, an alkylamine group, an aryloxy group, an arylamine group, an alkylepoxide group, a vinyl group, an alkylmercapto group, and an imide group,
   depositing the hole transport layer material to form a hole transport layer; and
   curing the hole transport layer by heat treatment to lower the surface energy of the hole transport layer.

12. The method of claim 11, wherein the organic compound derivative has a central metal atom and has a molecular weight ranging from about 100 to about 10,000 g/mol.

13. The method of claim 12, wherein the metal is selected from the group consisting of Ti, Pt and elements belonging to groups 3A and 4A of period 3 to period 5.

14. The method of claim 13, wherein the elements belonging to groups 3A and 4A of periods 3 to 5 includes metals selected from a group consisting of Si, Sn and Al.

15. The method of claim 12, wherein a concentration of the organic compound derivative ranges from about 0.0001 wt % to about 50 wt %.

16. The method of claim 11, further comprising a surfactant.

17. The method of claim 16, wherein the surfactant comprises a functional group selected from the group consisting of an alkyl group, an alkylaryl group, a fluoroalkyl group, and an alkylsiloxane group, a sulfate, a sulfonate, a carboxylate, an amide, a betainic structures, and a quarternised ammonium group.

18. The method of claim 17, wherein the surfactant includes a non-ionic surfactant.

19. The method of claim 18, wherein the non-ionic surfactant is a non-ionic fluoride-based surfactant.

20. The method of claim 16, wherein the surfactant has a concentration ranging from about 0.1 wt % to about 0.3 wt %.

21. The method of claim 11, further comprising:
   forming an organic light-emitting layer by spin coating, ink-jet printing, vacuum deposition, or laser induced thermal imaging.

22. The method of claim 21,
   wherein the hole transport layer includes a surfactant, and
   wherein the organic light-emitting layer is formed using an ink-jet technique.

23. The method of claim 22, wherein the surfactant is a non-ionic fluoride-based surfactant and has a concentration ranging from about 0.1 wt % to about 0.3 wt %.

24. A hole transport layer of an organic EL display, comprising:

one of a mixture of a poly (3,4)-ethylenedioxythiophene (PEDOT) and a polystyrenesulfonate, a mixture of a polyaniline (PANI) and a polystyrenesulfonate, and an aromatic amine derivative; and a surfactant comprising a functional group selected from the group consisting of an alkylaryl group, a sulfate, a carboxylate, an amide, a betainic structures, and a quarternised ammonium group.

25. The hole transport layer of claim 24, wherein the surfactant has a concentration ranging from about 0.1 wt % to about 0.3 wt %.

* * * * *